(12) United States Patent
Hossain et al.

(10) Patent No.: US 8,232,515 B2
(45) Date of Patent: Jul. 31, 2012

(54) IMAGING DEVICE HAVING A RADIATION DETECTING STRUCTURE DISPOSED AT A SEMICONDUCTOR SUBSTRATE WITH A THERMALIZING MATERIAL AND A FIRST RADIATION-REACTIVE MATERIAL SENSITIVE TO NEUTRON RADIATION

(75) Inventors: Timothy Z. Hossain, Austin, TX (US); Patrick Mark Clopton, Austin, TX (US); Clayton Fullwood, Austin, TX (US); Dan E. Posey, Granite Shoals, TX (US)

(73) Assignee: Spansion LLC, Sunnyvale, CA (US)

( * ) Notice: Subject to any disclaimer, the term of this patent is extended or adjusted under 35 U.S.C. 154(b) by 494 days.

(21) Appl. No.: 12/472,735

(22) Filed: May 27, 2009

(65) Prior Publication Data

US 2009/0302203 A1 Dec. 10, 2009

Related U.S. Application Data

(60) Provisional application No. 61/060,001, filed on Jun. 9, 2008.

(51) Int. Cl.
*H01L 31/00* (2006.01)
(52) U.S. Cl. ..................... 250/214.1; 250/239
(58) Field of Classification Search ............... 250/214.1, 250/214 R, 238, 239, 208.1, 207, 214 VT, 250/370.09–370.14, 338.1–338.4; 378/98.11, 378/98.12
See application file for complete search history.

(56) References Cited

U.S. PATENT DOCUMENTS

| 4,897,550 | A   | * | 1/1990  | Bernard et al.  | ......... 250/390.01 |
| 5,019,886 | A   |   | 5/1991  | Sato et al.     |                      |
| 6,075,261 | A   |   | 6/2000  | Hossain et al.  |                      |
| 6,194,727 | B1  | * | 2/2001  | Lee et al.      | ................. 250/370.09 |
| 7,109,859 | B2  |   | 9/2006  | Peeters         |                      |
| 2010/0294946 | A1 | * | 11/2010 | McCarthy     | ..................... 250/371 |

* cited by examiner

*Primary Examiner* — Que T Le

(57) ABSTRACT

An imaging device suitable for detecting certain imaging particles and recording the detection of imaging particles, and as such can include certain recording devices such as a charge storage structure.

20 Claims, 5 Drawing Sheets

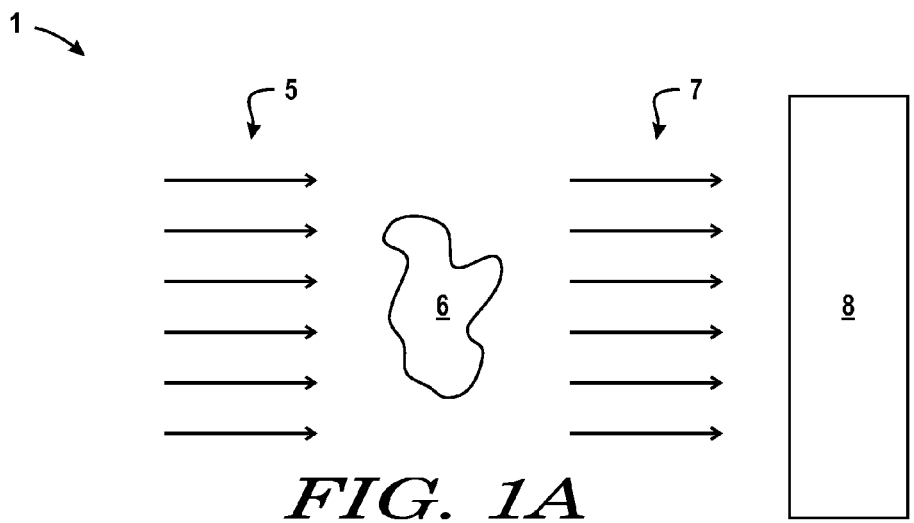
*FIG. 1A*
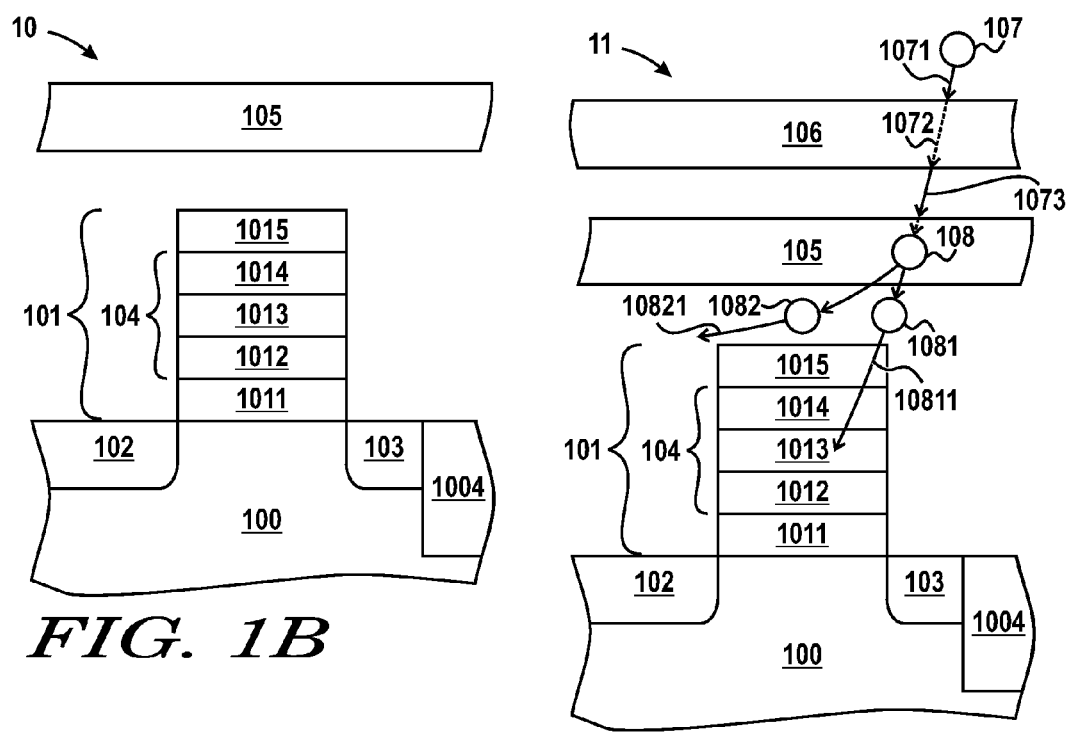
*FIG. 1B*
*FIG. 2*

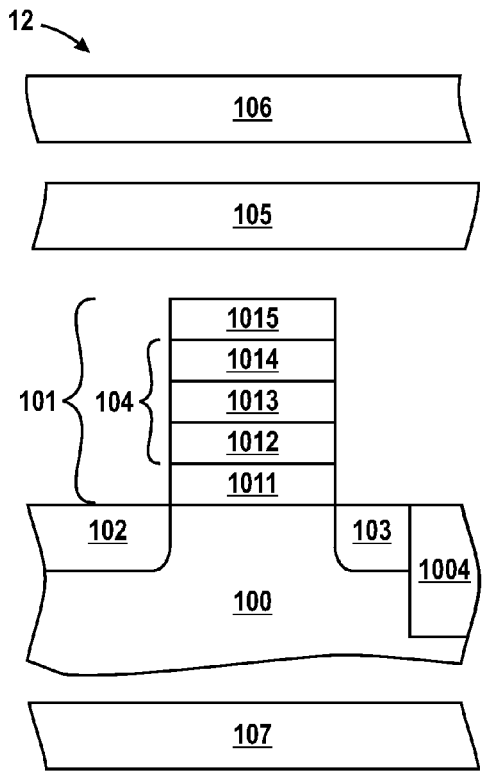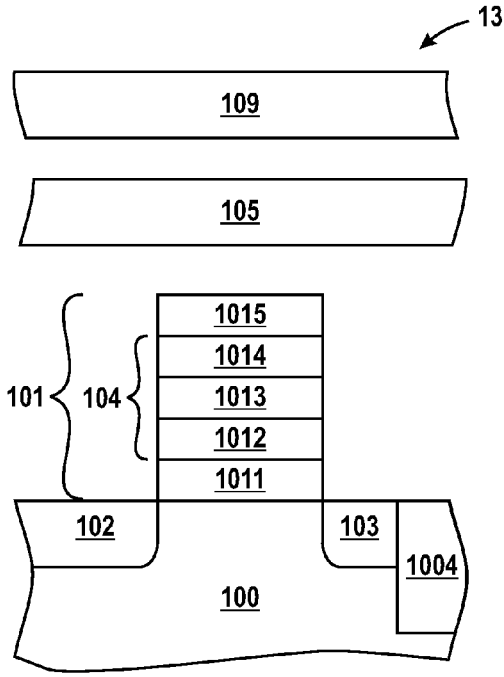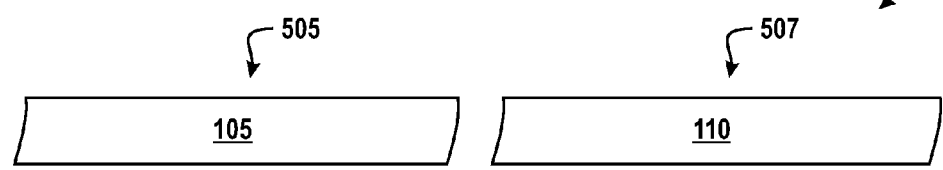

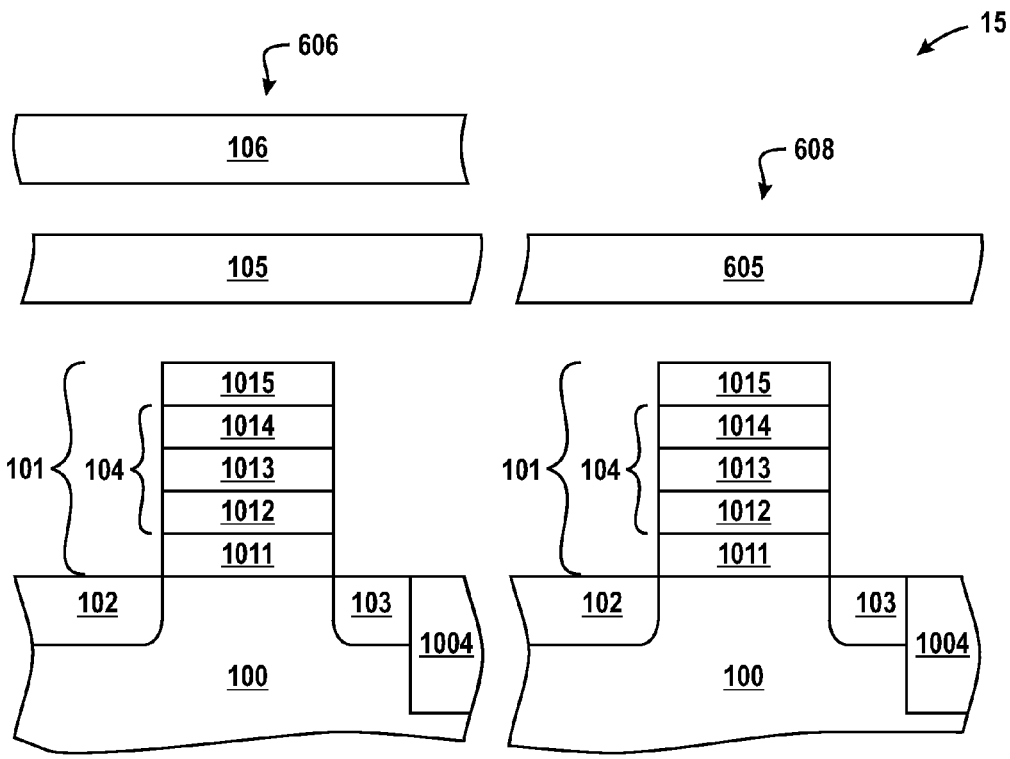
FIG. 6
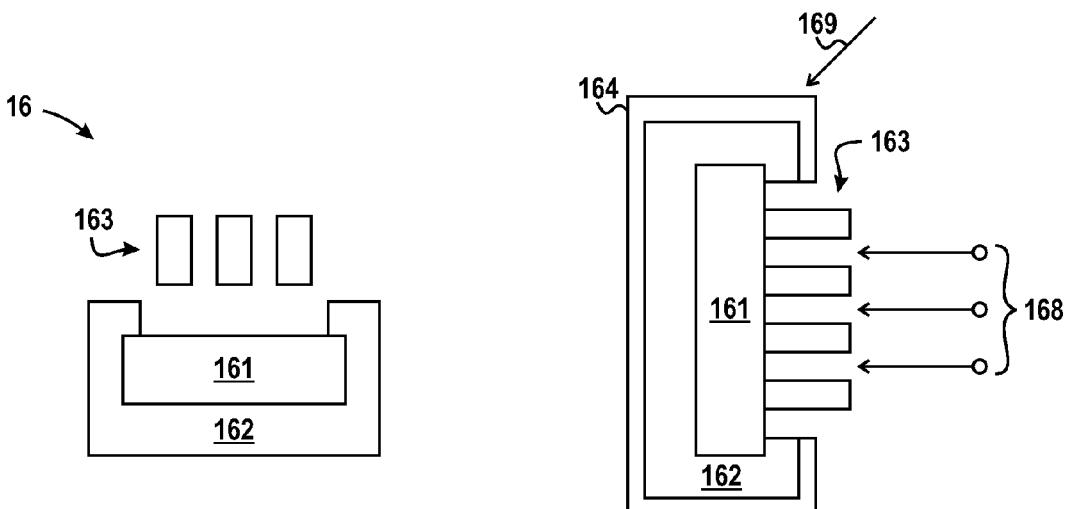
FIG. 7
FIG. 8

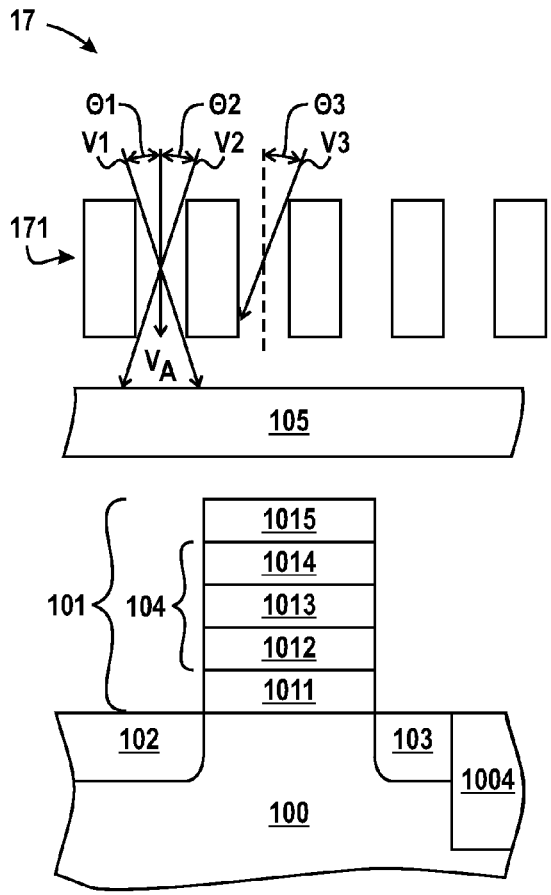
FIG. 9
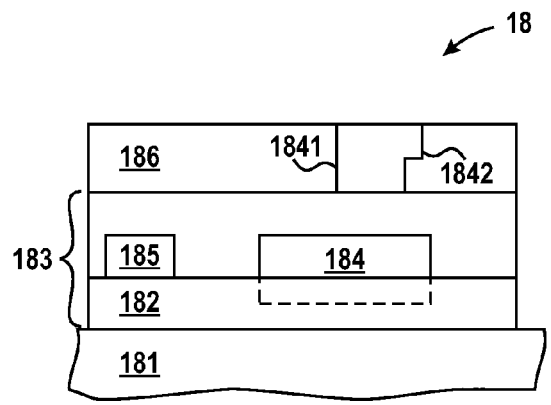
FIG. 10
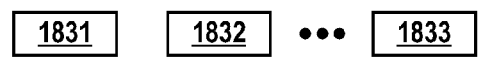
FIG. 11
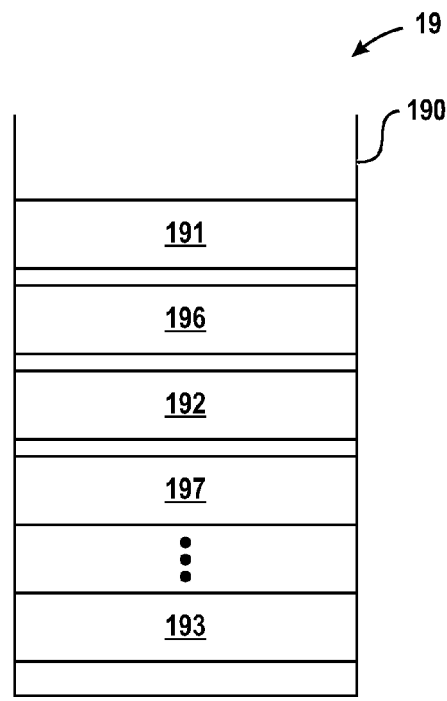
FIG. 12

IMAGING DEVICE HAVING A RADIATION DETECTING STRUCTURE DISPOSED AT A SEMICONDUCTOR SUBSTRATE WITH A THERMALIZING MATERIAL AND A FIRST RADIATION-REACTIVE MATERIAL SENSITIVE TO NEUTRON RADIATION

CROSS-REFERENCE TO RELATED APPLICATION(S)

The following disclosure is a non-provisional application which claims priority to U.S. Provisional Application No. 61/060,001 filed Jun. 9, 2008, entitled "Imaging Device" and having named inventor Timothy Z. Hossain, which application is incorporated by reference herein in its entirety.

BACKGROUND

1. Field of the Disclosure

The following disclosure is directed to cutting elements for use in drill bits, and particularly cutting elements incorporating a cutting body and a sleeve.

2. Description of the Related Art

Conventional neutron detectors generally include a sealed vessel containing a neutron sensitive gas, such as $^3$He or $BF_3$, and an electrically charged wire having leads which extend outside of the vessel. In operation, incident neutrons react with the gas to produce charged particles which change the electrical potential of the wire. A measurement system coupled to the charged wire measures the electrical pulses and uses this information to indicate the presence of neutrons. These types of neutrons detectors are undesirably bulky and are associated with poor sensitivity resulting from, for example, electronic noise.

Attempts have been made to produce different neutron detectors using materials such as semiconductors. For example, some devices rely upon diffusion of $^3$He into a semiconductor substrate to detect neutrons (See, U.S. Pat. No. 5,019,886) while others use certain other materials. However, these detects have a number of drawbacks, including difficulty in manufacturing.

BRIEF DESCRIPTION OF THE DRAWINGS

FIG. 1A includes a general illustration of an imaging device.

FIG. 1B includes an illustration of an imaging device in accordance with an embodiment.

FIG. 2 includes a cross-sectional illustration of a device including a radiation-detecting device in accordance with an embodiment.

FIG. 3 includes a cross-sectional illustration of a device including a radiation-detecting structure in accordance with an embodiment.

FIG. 4 includes a cross-sectional illustration of a device including a radiation-detecting structure in accordance with an embodiment.

FIG. 5 includes a cross-sectional illustration of a device that includes a radiation detecting structure.

FIG. 6 includes a cross-sectional illustration of a device including a radiation-detecting structure in accordance with an embodiment.

FIG. 7 includes a cross-sectional illustration of a device including a radiation-detecting device in accordance with an embodiment.

FIG. 8 includes a cross-sectional illustration of a device including a radiation-detecting device in accordance with an embodiment.

FIG. 9 includes a cross-sectional illustration of a radiation-detecting device in accordance with an embodiment.

FIG. 10 includes a cross-sectional illustration of a device including a radiation-detecting structure in accordance with an embodiment.

FIG. 11 includes an illustration of a portion of the radiation-detecting structure in accordance with an embodiment.

FIG. 12 includes a cross-sectional illustration of a device including a radiation-detecting structure in accordance with an embodiment.

DESCRIPTION OF THE DRAWINGS

Figure 13:
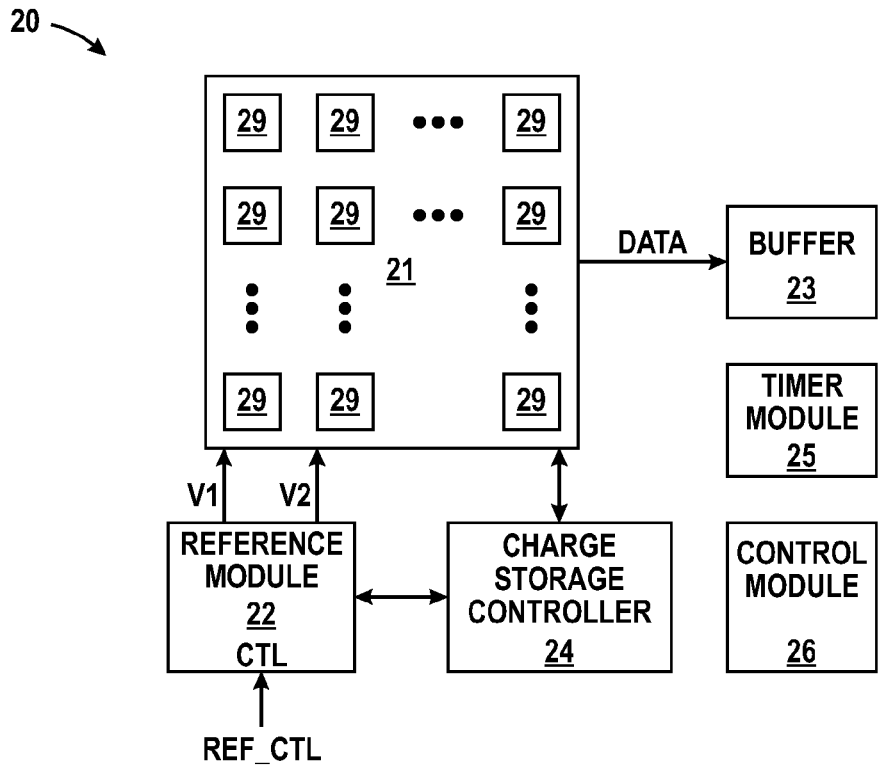
FIG. 13 illustrates a device that includes a radiation-detecting structure to detect radiation.

FIG. 1A includes an illustration of an imaging device and a method of capturing of an image of an object with the imaging device in accordance with an embodiment. As illustrated, imaging particles 5 can be directed at an object 6 such that they strike the object 6. In accordance with a particular embodiment, the imaging particles may be of a variety such that they interact with the object 6 and upon interacting with the object 6, spawned imaging particles 7 are generated. After the generation of the spawned imaging particles 7, such particles 7 can interact with the imaging device 8, which in certain embodiments can incorporate components sensitive to the spawned imaging particles 7. For example, in certain embodiments, imaging particles 5 may have characteristics in which when interacting with the object 6, spawned imaging particles 7 are generated having characteristics of certain forms of radiation, and the imaging device 8 can include a radiation-detecting device. In accordance with an embodiment, the imaging device can be formed such that it includes the object 6, such that the characteristics of the spawned imaging particles 7 are more easily detectable by the imaging device 8.

FIG. 1B includes a cross-sectional illustration of a device including a radiation-detecting structure, that can be used in accordance with a specific embodiment of the disclosure to create an image. As illustrated, the device 10 includes a substrate 100, generally suitable for supporting components. According to one embodiment, the substrate 100 can include a semiconductive material. Suitable semiconductive materials include silicon, germanium, and the like. In accordance with a particular embodiment, the substrate is made of a single crystal material, such as a single crystal silicon wafer.

As further illustrated in FIG. 1B, the device 10 includes a stack 101 made of a plurality of layers overlying the substrate 100. The stack 101 can represent a structure suitable got storing charges, for example, it may be a transistor gate stack having a charge storage structure. As illustrated, the stack 101 includes a layer 1011 disposed directly overlying and abutting an upper surface of the substrate 100. In accordance with a particular embodiment, layer 1011 can include a dielectric material. Suitable dielectric materials can include oxides, nitrides, and combinations thereof. In accordance with a particular embodiment, the layer 1011 includes silicon dioxide. Layer 1011 can be formed by growth techniques, deposition techniques, and the like.

As further illustrated in FIG. 1B, the stack 101 includes a charge storage structure 104 overlying the substrate 100.

Notably, the charge storage structure 104 includes a plurality of layers, particularly layers 1012, 1013, and 1014. It will be appreciated that the charge storage structure 104 facilitates the storage of charge therein, and thereby facilitates storage of data. Additionally, as illustrated in this particular embodiment, layers 1012, 1013, and 1014 are in direct contact with each other (i.e., abutting).

The charge storage structure 104 includes layer 1012 overlying and abutting layer 1011. In accordance with an embodiment, layer 1012 can include a dielectric material, such as those described in accordance with layer 1011. For example, layer 1012 can include silicon dioxide. Layer 1012 and layer 1011 can be distinct and separately formed layers, such as a native oxide layer 1011 and a thermally grown oxide layer 1012. Alternatively, it will be appreciated that layers 1012 and 1011 can be different regions of a commonly formed layer. Layer 1012 can be formed by growth techniques, deposition techniques, and the like.

The charge storage structure 104 further includes a layer 1013 overlying and abutting layer 1012. In accordance with an embodiment, layer 1013 includes a conductive material, such as a metal. According to an alternative embodiment, layer 1013 includes a non-conductive material, such as a nitride material. Other features of layer 1013 will be discussed in more detail herein. Layer 1013 can be formed by growth techniques, deposition techniques, and the like The charge storage structure 104 further includes layer 1014 overlying and abutting layer 1013. The layer 1014 can include a dielectric material such as those discussed in accordance with layer 1012. Layer 1014 can be formed by growth techniques, deposition techniques, and the like.

As further illustrated in FIG. 1B, the device 10 includes a layer 1015 overlying the charge storage structure 104. Layer 1015 can include a semiconductive material, a metal and the like. Suitable semiconductive materials can include silicon, germanium, gallium, and combinations thereof. In accordance with one particular embodiment, the layer 1015 includes a doped polysilicon.

The device 10 of FIG. 1B further includes a layer 105 overlying the charge storage structure 104 and the substrate 100. In accordance with a particular embodiment, the layer 105 is a radiation-reactive upper layer. As used herein, the term "radiation-reactive" refers to a layer or material having a high probability of interacting with radiation and further generating or spawning a charged particle/photon in reaction to such interactions with radiation. For example, one such radiation-reactive material is a material that includes boron-10 ($^{10}$B), which is an element having a high probability of interacting with radiated neutrons and spawning an alpha particle and a lithium-7 ($^{7}$Li) particle upon interacting with a neutron. In contrast, other forms of boron, such as boron-11 ($^{11}$B), are not considered radiation-reactive, as such elements do not have a tendency to react with radiated neutrons. Accordingly, materials or layers that include a radiation-reactive material, such as a material having a radiation-reactive element such as boron-10 ($^{10}$B), lithium-6 ($^{6}$Li), cadmium-113 ($^{113}$Cd), and gadolinium-157($^{157}$Gd), (OK) or a combination thereof. Additionally, radiation-reactive materials can be made of materials including such elements, for example, boron nitride including boron-10, boron carbide including boron-10, and lithium nitride including lithium-6.

In accordance with an embodiment, layer 105 is a radiation-reactive layer including a radiation reactive material. For example, according to a particular embodiment, layer 105 includes boron. In accordance with more particular embodiments, layer 105 can include a certain percentage of boron, such that at least about 5% of the boron atoms within the layer are boron-10 atoms. Still, in other embodiments this concentration may be greater, such as at least about 10%, at least about 25%, or at least about 50%. Still, particular embodiments may use a concentration of boron-10 atoms within layer 105 that is not greater than about 80% of the total boron atoms present within layer 105. Still, particular embodiments may use a concentration of boron-10 atoms within layer 105 that is greater than about 80% of the total boron atoms present within layer 105.

Layer 105 can have an average thickness that is at least about 3 microns, particularly in those application using boron-10. In other embodiments, the average thickness of layer 105 can be greater, such as at least about 5 microns, at least about 8 microns, 10 microns, 15 microns or even at least about 20 microns. In accordance with a particular embodiment, the average thickness of layer 105 is within a range between about 3 microns and about 20 microns, and even more particularly between about 5 microns and about 15 microns. Notably, certain materials may be more suitable for use with thicker layers, for example lithium, i.e., lithium-6.

Referring again to the charge storage structure 104, as described previously, layer 1013 can include a charge storage material such as silicon nitride. Still, in other particular embodiments, the layer 1013 can include a radiation-reactive material such as that described in accordance with layer 105. For example, according to an embodiment, a material of layer 1013 includes boron, for example boron nitride, where a concentration of the boron is boron-10. As discussed above in accordance with layer 105, layer 1013 can include certain concentrations of boron-10 atoms as identified above.

While reference to the charge storage structure 104 has been made, wherein layer 1013 can be made of a non-conductive material, such as silicon nitride, it will be appreciated, in other embodiments the charge storage structure 104 can incorporate a conductive layer. For example, the charge storage structure can include an isolated conductive layer, such as a metal-containing layer. Moreover, while the embodiment of FIG. 1B has illustrated a charge storage structure 104 as part of a transistor stack, it will be appreciated that in other embodiments charge storage structures need not be incorporated as part of a transistor stack.

As such, the average thickness of the layer 1013 when using a radiation-reactive material can be within a range between about 1 nm and about 500 nm, such as within a range between about 2 nm and about 250 nm, or even more particularly within a range between about 10 nm and about 100 nm.

FIG. 1B further illustrates regions 102 and 103 within the substrate 100 and underlying portions of the stack 101. In accordance with a particular embodiment, regions 102 and 103 can be implant regions within the substrate 100 suitable for allowing flow of electrons through a transistor that is associated with the stack 101. In accordance with a particular embodiment, regions 102 and 103 can be doped source/drain regions, including a n-type or p-type dopant material. In more particular instances, regions 102 and 103 can include a radiation-reactive material. For example, in accordance with on embodiment, the regions 102 and 103 include boron-10. The region directly underlying the stack 101 is a channel region that can be doped to have the opposite conductivity-type as the source drain regions.

As will be appreciated, a radiation-detecting structure of the device 10 includes substrate 100, the source/drain regions 102 and 103 and channel region within the substrate 100, the stack 101, and layer 105 as described above. As used throughout the subsequent description, a radiation-detecting structure will be generally be understood to incorporate similar elements unless otherwise stated. It will be appreciated that other elements may be considered part of the radiation-detecting structure, for example, other regions, structures, and components that are used to detect the occurrence of a radiation event.

FIG. 1B further illustrates region 1004 within the substrate 100 adjacent to, and in particular, abutting region 103. In one particular instance, region 1004 can be a field isolation region suitable for electrically insulating the source drain region 103 from other adjacent source/drain regions, for example separation of multiple transistors disposed at the substrate 100. In accordance with one embodiment, the region 1004 can include a radiation-reactive material. For example, in certain embodiments, the region 1004 can include a dielectric compound including the radiation-reactive material such as boron nitride, boron carbide, or lithium nitride.

FIG. 2 includes a cross-sectional illustration of a device 11 including a radiation-detecting device in accordance with an embodiment. In particular, the device 11 includes a radiation-detecting structure similar to that described at FIG. 1B with the addition of layer 106 overlying layer 105. In particular, the radiation-detecting structure includes the elements previously identified and the layer 106.

As further illustrated in FIG. 2, the radiation-detecting structure of device 11 includes a layer 106 overlying layer 105. In particular, layer 106 can include a thermalizing material. As used herein, reference to a thermalizing material is reference to a material capable of slowing down a particular type of radiation, thus making it more apt to be detected by the radiation-detecting structure. For example, with respect to neutron radiation, suitable thermalizing materials can include hydrogen-containing materials, deuterium-containing material, and carbon-containing materials. Accordingly, thermalizing materials can include metals, ceramics, polymers, or combinations thereof. In certain particular embodiments, the thermalizing material is a polymer material incorporating such hydrogen-containing materials, deuterium-containing materials, carbon-containing materials, or a combination thereof. For example, in one particular embodiment, suitable polymer thermalizing materials can include polyolefins, polyamids, polyimids, polyesters, polystyrenes, polycarbonates, polyurethanes, polyethers, polysulphones, polyvinyls, and polyactic acids, or combinations thereof.

FIG. 2 further illustrates a thermalizing event with respect to a particle 107. In accordance with a particular embodiment, particle 107 can include a neutron particle traveling on a path 1071 towards layer 106. Upon striking and interacting with layer 106, the neutron particle 107 is slowed, i.e., thermalized, and has a path 1072 through the layer 106 containing the thermalizing material. Upon slowing of the neutron particle 107, it exits layer 106 and travels along path 1073 towards the layer 105 which according to embodiments herein contains a radiation-reactive material. Upon striking the layer 105 containing the radiation-reactive material, such as boron-10, the particle 107, e.g., a neutron, reacts with the boron-10 atom and the resulting reaction generates two particles 1082 and 1081 that exit the layer 105 upon paths 10821 and 10811.

In particular reference to neutron particles, during such a reaction with boron-10, the particles spawned as a result of the interaction between the neutron particle 107 and boron-10 particle 108 result in the generation of an alpha particle and a lithium 7 particle. The emitted particles 1082 and 1081 that result from the interaction of the neutron particle 107 with the boron-10 atom 108 can cause a modification of the charge stored within charge storage structure 104, which can be detected as a change of charge storage state. In one embodiment, the charge-detecting device detects a change of charge storage state as a change in conductive state of a transistor associated with the charge storage structure that has had is charge modified. In particular, it is thought that the generation of a particle/or photon 1081 extending along path 10811, as illustrated in FIG. 2, interacts with the material of the charge storage structure 104 to cause a change of state. In further reference to FIG. 2, in accordance with a particular embodiment, the layer 106 includes a thermalizing material as described herein. In certain other embodiments, other layers within the radiation-detecting structure 11 can include thermalizing materials. For instance, a portion of the charge storage structure 104 can include a thermalizing material. Suitable layers within the charge storage structure containing the thermalizing material can include dielectric layers, such as 1014 and 1012. In accordance with one particular embodiment, the dielectric layers 1014 and 1012 may be particularly suited to include a thermalizing material such as deuterium. For example, formation of such layers may be carried out such that the reactants (e.g., Silane™) include the thermalizing material such as deuterium, such that when the layers 1012 and 1014 are formed, they naturally include the thermalizing material.

FIG. 3 includes a cross-sectional illustration of a device 12 including a radiation-detecting structure in accordance with an embodiment. In particular, FIG. 3 illustrates substantially the same radiation-detecting structure as illustrated in FIG. 2 with the addition of layer 107. According to an embodiment, layer 107 can include a thermalizing material, such as those previously described in accordance with layer 106. The illustrated radiation-detecting structure facilitates thermalization of radiation from above and below the charge storage region 104, improving the probability that non-thermalized radiation will be detected. Moreover, according to a particular embodiment, the charge storage structure 104 can be sealed within the thermalizing material. For example, in a more particular embodiment, the charge storage structure is hermetically sealed within thermalizing material such that it is not exposed to an ambient environment.

FIG. 4 includes a cross-sectional illustration of a device 13 including a radiation-detecting structure in accordance with an embodiment. In accordance with a particular embodiment, the device 13 can be formed such that it is sensitive to multiple types of radiation. For example, device 13 includes multiple layers of radiation-reactive materials, each layer reactive to different types of radiation, and wherein each of the layers are associated with a single radiation-detecting structure. Accordingly, as illustrated in FIG. 4, the radiation-detecting structure 13 is similar to that described a FIG. 1B and includes a layer 109 overlying layer 105 that includes a radiation-reactive material sensitive to a different type of radiation than that of layer 105. For example, in accordance with one embodiment, layer 105 may include a radiation-reactive material that is sensitive to neutrons, and as such includes boron, while layer 109 includes a radiation-reactive material that is sensitive to a different type radiation, such as gamma ray radiation, and accordingly may include a different material that than in layer 105, such as lead or gadolinium.

FIG. 5 includes a cross-sectional illustration of a device 14 that includes a radiation detecting structure. Notably, the radiation-detecting structure includes a first radiation-detecting portion 505 and a second radiation-detecting portion 507 separate and spaced apart from the first radiation detecting portion 505. The second radiation-detecting portion 507 includes elements identified with the radiation-detecting structure of FIG. 1B and additionally includes a second set of similarly numbered elements and a layer 110.

In accordance with a particular embodiment, the device 14 includes a radiation-detecting structure having a charge storage structure 104 associated with layer 105, that includes a radiation-reactive material sensitive to a first radiation type, and a second radiation-detecting portion includes a second charge storage structure 504 associated with a layer 110, including a second radiation-reactive material sensitive to a second radiation type. Such a configuration facilitates the detection and reaction of components within the same substrate to multiple forms of radiation, including for example, neutron particles, gamma ray radiation, x-ray radiation, and other types of radiation and subatomic particles.

Accordingly, it will be noted that FIG. 4 illustrates a radiation-detecting structure having a single stack associated with multiple radiation-reactive materials, while FIG. 5 illustrates an alternative embodiment, in which a radiation-detecting portions includes two distinct and different associated elements (i.e., stacks), such that each portion is sensitive to a different radiation type. With regard to the later, such a configuration may be advantageous when an array of stacks are formed at a single substrate.

FIG. 6 includes a cross-sectional illustration of a device including a radiation-detecting structure in accordance with an embodiment. In particular, radiation-detecting structure includes a first radiation-detecting portion 606 and a second radiation-detecting portion 608 spaced apart from the first radiation-detecting portion 606, wherein each portion is associated with two separate transistor structures similar to that described at FIG. 5, with layer 110 excluded from the second radiation-detecting portion 608. The second radiation-detecting portion 608 includes the same region and layers as the structure described in FIG. 1B. Notably, the first radiation-detecting portion 606 includes layer 106 overlying layer 105, which as previously described, can include a thermalizing material. The second radiation-detecting portion 608 includes an overlying layer 605, which can include a radiation-reactive material, but does not include including a second overlying layer having thermalizing material, as associated with the first radiation-detecting portion 606. As such, the second radiation-detecting portion 608 is exposed to the environment external to the thermalizing material. Accordingly, the first radiation-detecting portion 606 will be more capable of detecting higher energy radiation particles as opposed to the second radiation-detecting portion 608 since it utilizes the thermalizing material within layer 106.

FIG. 7 includes a cross-sectional illustration of a device 16 including a radiation-detecting device in accordance with an embodiment. In particular, FIG. 7 illustrates a radiation-detecting device of device 161 including a neutron-detecting structure as described herein, where device 161 is disposed within a housing 162. In accordance with one embodiment, the neutron-detecting structure of device 161 can include the elements of the radiation-detecting structures previously described. In accordance with a particular embodiment, the neutron-detecting structure of device 161 can include an array of charge storage structures.

The housing 162 can be a container sufficient to engage or contain therein the neutron-detecting structure of device 161. For example, in accordance with an embodiment, the housing 162 can include a metal, polymer, or ceramic material, or any combination thereof. In accordance with a particular embodiment, the housing 162 can substantially surround the neutron-detecting structure of device 161, such that it covers an majority of the external surface area of the neutron-detecting structure 161.

As further illustrated, the device 16 includes a metal-containing shielding 163 overlying a portion of the housing 162 and a portion of the neutron-detecting structure of device 161. In particular, the metal-containing shielding 163 can include a radiation-absorbing material, and more particularly, a neutron-absorbing material. Herein, a radiation-absorbing material is one that is capable of trapping or stopping certain forms of radiation from passing through. For example, a neutron-absorbing material is a material that has a high probability of intercepting a neutron and interacting with a neutron, i.e., a high cross-section. For example, certain suitable neutron-absorbing materials have a cross-section of at least about 1000 barns, and more particularly at least about 3000 barns. According to an embodiment, suitable neutron-absorbing materials can include metals, such as cadmium, gadolinium, or a combination thereof.

As further illustrated in FIG. 7, the metal-containing shielding 163 can be patterned, such that it only allows radiation traveling along certain predetermined vectors to interact with the neutron-detecting structure, while radiation traveling along other vectors that strike the metal-containing shielding 163 and are absorbed. For example, as illustrated in FIG. 7, the metal-containing shielding 163 can be patterned such that it is in the form of a grating.

FIG. 8 includes a cross-sectional illustration of a device 800 including a radiation-detecting device in accordance with an embodiment. The device 800 includes the elements previously illustrated in FIG. 7 with the addition of a layer 164 overlying the housing 162. According to an embodiment, the layer 164 can include a neutron-absorbing material such as those previously described. As such, neutrons 168 which are directed at the neutron-detecting structure 161 along a collinear orientation are capable of passing through the metal-containing shielding 163 and interacting with the neutron-detecting structure 161. By contrast, neutrons traveling along other directions, such as neutron 169, impact the layer 164 containing the neutron-absorbing material and are absorbed and thus not allowed to interact with the neutron-detecting structure 161. As such, the device 800 includes a highly directionalized radiation-detecting structure that is suited to detect radiation traveling along certain directions.

FIG. 9 includes a cross-sectional illustration of a radiation-detecting device in accordance with an embodiment. In particular, the radiation-detecting device 17 includes a radiation-detecting structure 10 including those elements described previously. In addition, the radiation-detecting device 17 includes a metal-containing structure 171 in the form of a grating to control the passage of radiation therethrough. As such, the radiation-detecting structure 10 is integrated at a substrate 100 such that it can be exposed to radiation traveling along a first plurality of vectors and substantially unexposed to radiation traveling along a second type of vector. That is, radiation illustrated in FIG. 9 traveling along vectors V1 and V2 substantially passes through the metal-containing structure 171, including a radiation-absorbing material, and interacts with the layer 105 including the radiation-reactive material. By contrast, radiation traveling along vector V3 is at an angle such that it is not allowed to pass through the metal-containing structure 171 and is absorbed therein, thus not striking the layer 105 and interacting accordingly.

As further illustrated in FIG. 9, the vectors V1 and V2 may be averaged such that they have an average vector VA defining a vector sufficient to pass through the metal-containing structure 171. By contrast, the radiation traveling along vector V3 can have a different average vector, including all other vectors that are insufficient to pass through the metal-containing structure 171 defining a separation angle between those vectors allowed to pass through and those vectors incapable of passing through the metal-containing structure 171. In accordance with one embodiment, the difference between the first average vector and the second average vector is at least about 90°.

In accordance with a particular embodiment, the metal-containing shielding 171 may be formed to overlie layer 105. The metal-containing shielding 171 can be formed by a photolithography technique.

FIG. 10 includes a cross-sectional illustration of a device 18 including a radiation-detecting structure in accordance with an embodiment. In particular, the device 18 includes a base 181, a substrate 182 overlying the base 181, where the substrate 182 is part of an integrated circuit device 183. The integrated circuit 183 further includes a logic circuit 185 electrically coupled to the radiation-detecting structure 184. A cover 186 overlies the radiation-detecting structure 184.

The base 181 provides a rigid support suitable for the integrated circuit 183, and particularly the substrate 182. As such, the base 181 can include a metal, polymer, or ceramic material. In accordance with one embodiment, the base 181 includes a ceramic material such as an oxide, carbide, nitride, boride, or a combination thereof. In accordance with another embodiment, the base 181 can include a radiation-absorbing material, more particularly a neutron-absorbing material. As such, suitable neutron-absorbing materials can include metals, such as cadmium or gadolinium.

The base 181 can further be configured such that it has a size that is greater than that of the substrate 182. For example, the base 181 can have a diameter and thickness greater than that of the substrate 182 and the integrated circuit 183. Additionally, while not illustrated in the embodiment of FIG. 10, the base 181 can be shaped such that it covers and comes in direct contact with a majority of the external surface area of the substrate 182. For example, in one certain embodiment the base 181 wraps around the sides of the substrate 182. In another particular embodiment, the substrate 182 can be disposed within an interior space within the base 181, such that the substrate 182 is recessed within an opening in the base 181.

The substrate 182 can provide a support suitable for formation of the radiation-detecting structure 184 thereon. In accordance with an embodiment, the substrate can include a semiconductor material, such as silicon, germanium, and the like. More particularly, in another embodiment, the substrate can include a single crystal material, such that in certain instances the substrate 182 can be an entire single crystal wafer used in processing microelectronic devices, or a portion of an entire single crystal layer. For example, in one particular embodiment, the substrate 182 is a semiconductor-on-insulator material, or bulk semiconductor material. According to an alternative embodiment, the substrate 182 can include an amorphous material, such that it can be a glass, and more particularly a glass panel, such as used in the LCD display industry.

Generally, the substrate 182 has a size sufficient to hold the structures thereon. As such, according to one embodiment, the substrate 182 can have a diameter of at least about 10 cm. In other embodiments, the substrate 182 has a greater diameter, such as at least about 15 cm, at least about 20 cm, and more particularly within a range between about 10 cm and about 60 cm.

In further reference to the geometry of the substrate 182, generally the substrate 182 has a thickness such that it is sufficiently rigid and strong to be mounted on the base 181 and support the radiation-detecting structure 184. As such, in one embodiment, the substrate has an average thickness of at least about 0.5 mm. In other embodiments, the substrate has a thickness that is on the order of at least about 0.75 mm, at least about 1 mm, at least about 3 mm, and particularly within a range between about 0.5 mm and about 5 mm, such that in certain particular embodiments the substrate can be an unpolished wafer.

The radiation-detecting structure 184 is disposed at the substrate 182. In particular, the radiation-detecting structure 184 can include a memory array having an array of charge storage structures. Notably, the radiation-detecting structure 184 can include features previously described and illustrated in FIGS. 1-6. In fact, referring briefly to FIG. 11, a portion of the radiation-detecting structure 184 is illustrated. In particular, the radiation-detecting structure 184 includes an array of charge storage structures including charge storage structures 1831, 1832, and 1833, wherein each of the charge storage structures can include those components illustrated in FIG. 1B. In accordance with a particular embodiment, the radiation-detecting structure 184 includes an array of charge storage structures such that the radiation detecting structure 184 includes not less than about 100 charge storage structures. Other embodiments may utilize more, such as not less than about 200, not less than 300, or even not less than 500 charge storage structures.

Referring again to FIG. 10, a logic circuit 185 is disposed at the substrate 182. In accordance with a particular embodiment, the logic circuit 185 is electrically coupled to the radiation-detecting structure 184 such that it is capable of controlling the charge storage structures and performing certain operations, such as various operations associated with detecting the occurrence of a radiation event.

As such, it will be appreciated that the combination of the substrate, radiation-detecting structure 184, and logic circuit 185 can form at the integrated circuit 183 overlying the base 181. As such, other electrical components (e.g., capacitors, diodes, etc.) not currently illustrated may be included in the device 18, and more particularly disposed at the substrate 182 for interaction with the logic circuit 185 and radiation-detecting structure 184.

The device 18 further includes a cover 186 overlying the radiation-detecting structure 184, and more particularly overlying the upper surface of the integrated circuit 183. The cover can provide protection from environmental factors, such as dust and the like that may damage the components of the integrated circuit 183. In accordance with a particular embodiment, the cover 186 can be a flexible material, and may include a polymer. In certain embodiments, the cover 186 may be mechanically coupled to a portion of the base 181. Still, in other embodiments, the cover 186 may be mechanically coupled to portions of the substrate 182.

In fact, according to one particular embodiment, the cover 186 can be a flexible circuit, having conductive busses and electrodes disposed therein for electrical connection to the integrated circuit 183. That is, according to one embodiment, the cover 186 can be an interposer capable of providing electrical connections between an upper surface of the integrated circuit 183 and external contact of the interposer. For example, cover 186 can include electrical connections or interconnects 1841 and 1842 extending from an upper surface of the cover 186 to an upper surface of the integrated circuit 183 for electrical connection to components within the integrated circuit 183, such as the radiation-detecting structure 184.

FIG. 12 includes a cross-sectional illustration of a device including a radiation-detecting structure in accordance with an embodiment. In particular, the device 19 includes a housing 190 and a plurality of radiation-detecting structures 191, 192, and 193 (191-193) contained therein. In particular, the radiation-detecting structures 191-193 can be stacked and aligned within the housing such that they are suitably arranged to detect a radiation event with a higher probability. As such, in accordance with one particular embodiment, the radiation-detecting structures 191-193 can include those radiation-detecting structures as illustrated in FIG. 1B, that is a device having a single charge storage structure. In such embodiments, the device can be a portable device, capable of being integrated within portable or personal devices.

Alternatively, the radiation-detecting structures 191-193 can include those devices as illustrated in FIG. 10 including a base, substrate, radiation-detecting structure at the substrate, and a cover. Such a design can incorporate multiple radiation-detecting structures, each radiation-detecting structure having an array of charge storage structures. As will be appreciated, such a structure may be larger than structures incorporating a single charge storage structure. Still, such structure can be portable, but may further be mountable at strategic locations.

As further illustrated in FIG. 12 and in accordance with a particular embodiment, the radiation-detection structures are aligned within the housing such that the major surfaces of each of the substrates (or bases) are substantially coplanar with each other. Moreover, in accordance with another particular embodiment, the radiation-detecting structures 191-193 can be laterally spaced apart from each other and separated by material layers 196 and 197. In accordance with a particular embodiment, material layers 196 and 197 can include a thermalizing material. Utilization of a thermalizing material between the radiation-detecting structures 191-193 can improve the probability of detecting a radiation event.

FIG. 13 illustrates a device 20 that includes a radiation-detecting structure to detect radiation. Specifically, the radiation-detecting structure includes an array of charge storage structures 21, a reference module 22, a buffer 23, charge storage controller 24, a timer module 25, and a control module 26. The array of charge storage structures 21 includes a plurality of individual charge storage structures 29. It will be appreciated that each of the charge storage structures 29 can represent a charge storage structure, such as structure 104 previously described, which can be associated with a transistor device, or other electronic device.

The device 20 represents an integrated circuit device, whereby the elements illustrated at FIG. 8 represent various devices integrated at a common substrate, such as a semiconductor substrate. Reference module 22 provides voltage reference signals to the array of charge storage structures 21. For example, as previously described, the charge storage structures can be associated with corresponding transistors, and the reference voltages v1 and v2 provided by the reference module 22 can be used to modify charge stored at each of the charge storage structures 29, and to bias circuitry associated with a charge storage structure to determine its current storage state. The reference module 22 can be a controllable digital signal reference module. As such, the value of voltage reference signals provided by the reference module 22 can be selectably controlled based upon reference control input information received at its input labeled CTL. The signal labeled "Ref_CTL" can be received from a control module 26, or from other portions of the device 20.

The control module 26 can be used to control various portions of device 120 to determine a state of each of the charge storage structures 29. In one embodiment, the control module 26 provides control signals to the reference module 22 to determine whether or not a transistor associated with a specific storage structure 29 is in a conductive or non-conductive state for a specific read voltage applied at its control gate. By determining whether any one of the charge storage structures 29 is in a different read state than expected, a radiation event can be detected.

In accordance with a specific embodiment, the control module 26 can operate during a detect operation to load state information from each of the charge storage structures 29 into a buffer 23, which can be a memory array such as an SRAM, to allow for fast access. In other words, control information can be provided from a control module 26 to the buffer 23 and the array of charge storage structures 21 in order to provide state information of the charge storage structures 29 to the buffer 23. Once the state information is stored at buffer 23, the states of the each charge storage structure 29 can be modified to an original desired state, and the previous state information can be read from the buffer in an efficient manner.

Charge storage controller 24 is illustrated is connected to the array of charge storage structures 21 and the reference module 22. The charge storage controller 24 controls an amount of charge stored at each one of the charge storage structures 29. Operation of the charge storage controller 24 can be better understood with respect to FIG. 14.

Figure 14:
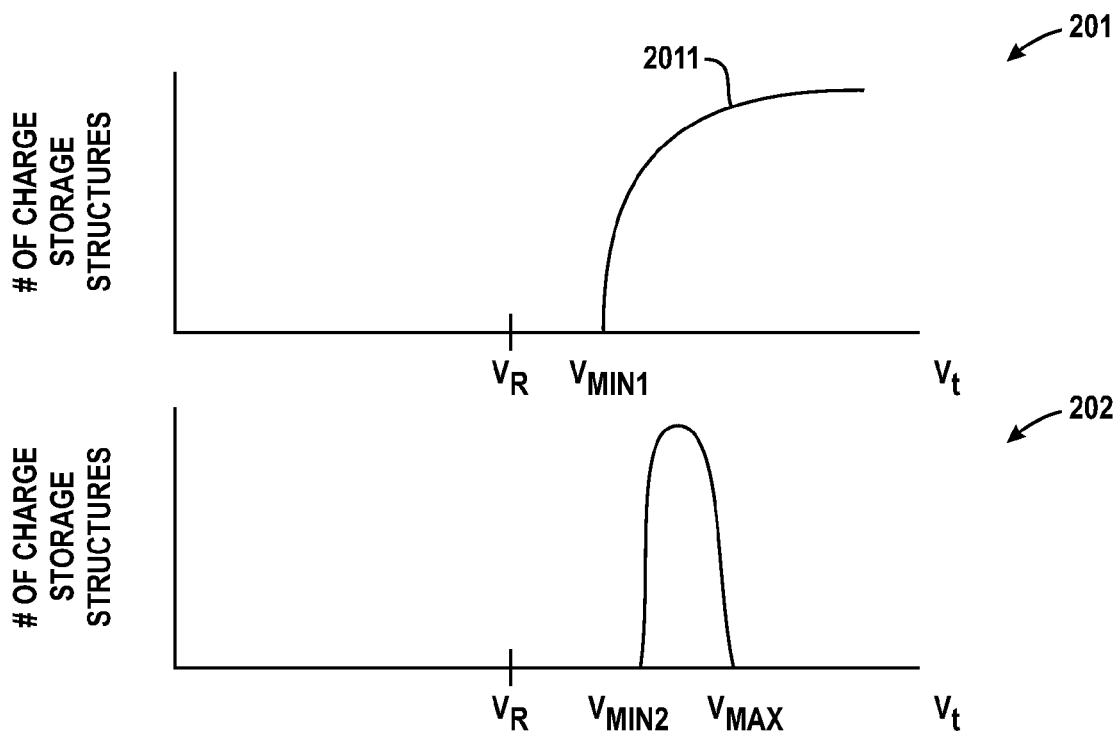
FIG. 14 includes two graphs including plots of number of charge storage elements versus their corresponding threshold voltages.

FIG. 14 illustrates a graph 201 and a graph 202. The curve 2011 of graph 201 represents the number of charge storage elements 29, the x-axis, that are associated with a corresponding transistor having a specific voltage threshold indicated along the y-axis. For example, referring to charge storage structure 104 as previously described, it is incorporated within a transistor that will either be conductive or non-conductive, depending upon a read voltage ($V_R$) applied at its control gate. The voltage $V_R$ represents a read voltage applied to a transistor, such as that associated with charge storage structure 104 of FIG. 1B. Therefore, graph 201 represents the distribution of voltage thresholds amongst all the members of a charge storage array prior to being exposed to any radiation. For example, after manufacturing, graph 201 can represent a distribution of voltage thresholds for transistors associated with charge storage structures after manufacturing, whereby each transistor has a voltage threshold at or above a minimum voltage $V_{MIN1}$. However, as illustrated at graph 201, the threshold voltages are widely distributed among $V_{MIN1}$. In order to better detect a radiation event, which is assumed for purposes of illustration to shift a voltage threshold of a transistor to a lower voltage by a deterministic amount, it can be desirable to set an amount of charge at each one of the charge storage structures such that its associated transistor will have a voltage threshold within a relatively narrow distribution. Moreover, the amount of charge at each one of the charge storage structures can be set such that it distinguishes between radiation events, that is particular types of radiation can be detected and other types need not be detected. For example, the amount of charge can be set to determine neutron-based radiation events and not gamma-ray radiation events.

For example, the charge storage controller 24 of FIG. 13 can be used to set an amount of charge at each one of the charge storage structures 29 by providing or removing electrons into the charge storage structure. By applying and removing electrons, and accessing a charge storage structure's transistor to determine a current threshold voltage, a tighter distribution of voltage thresholds for each one of the charge storage structures can be obtained. For example, the voltage range between $V_{MIN2}$ and $V_{MAX}$ can be not greater than about 2 volts, not greater than about 1 volt, or not greater than about 0.6 volts. It will be noted that the voltage $V_{MIN2}$ is greater than the read voltage $V_R$ in the embodiment illustrated. It will also be noted that the values of each of the voltage indicated, for example $V_R$, $V_{MIN2}$, and $V_{MAX}$ can be selectively controlled based upon control signal Ref_CTL, which is provided to the reference module 22.

The timing module 25 can be used to control when periodic accesses by the radiation detection structure are made. For example, during a detection mode of operation, the timer module would maintain a count, or a time to determine when to read information stored at the charge storage structures 2 to determine if a radiation event has occurred. During this detection mode, no power need be applied to the array of charge storage structures 21, nor to the elements used to detect a radiation event, in that the charge storage elements as previously described do not need applied operating power to have their charges modified, as the operating power needed to modify the charge stored at a charge storage structure is provided by the radiation being detected in response to a radiation event. The radiation detection structure that includes a charge storage structure of the array of charge storage structures 21, and its associated circuitry only needs to be powered when the information at the array of charge storage structures 21 is being accessed.

It will be appreciated that the various devices and methods discussed above can be used in a variety of applications. For example, the applications can include imaging applications and monitoring applications.

With respect to imaging applications, it would appreciated that the devices disclosed herein can be used to create images for to various scientific applications that need an image based upon the detection of radiation particles generated as a result of an analysis of particle collisions.

Another example of an imaging application would include a medical application, such as part of a medical treatment. For example, during a cancer treatment, a desired location of the body has been tagged, e.g., introduced, with a specific radiation-reactive material, such as a material that includes boron 10, that is subsequently exposed to a radiation source, such as a neutron beam. It will be appreciated that in an application such as this, a detection device such as that described herein could be used as an imaging device placed behind the portion of the body being treated to determine what portion of a neutron stream is being absorbed by the area being treated. For example, if a known amount of neutrons are being generated by a neutron stream, and a count at the neutron detector placed behind the patient indicates that none of the neutrons are being absorbed by the body, a realignment may be in order, or an indication that the treatment may be stopped. Alternatively, if a given portion of the neutrons are being absorbed, that can be detected and detected by the imaging device placed behind the patient, thereby allowing an amount of radiation applied to the affected part of the body to be monitored. Such applications could be useful in surgical applications.

Examples of monitoring applications include security applications, such as Homeland Security applications to monitor the presence of nuclear materials, and help physics applications. The monitoring can be for detecting the presence of a nuclear material, or to accumulate the amount of exposure a specific location has experienced with respect to a radiation type being detected.

A number of mobile device applications are anticipated. These mobile device applications can include personal mobile devices and transportation vehicles devices. For example, personal mobile devices can include electronic and non-electronic devices. Personal mobile electronic devices include such things as personal digital assistant devices, cell phones, computers, and any other hand-held or portable electronic personal device. Non-electronic mobile devices can include articles of clothing and accessories, such as badges, purses, wallets, and the like.

Examples of transportation vehicles can include land-based transportation vehicles, water-based transportation vehicles, and air-based transportation vehicles.

Stationary monitoring applications are also anticipated. For example, the devices and methods described herein could be used for monitoring radiation at stationary locations. For example, the stationary location could at a nuclear reactor site, inside of a building, outside of a building, or any other locations where it would be useful to determine whether or not a neutron source has been detected.

It is anticipated that various applications would include incorporating a device or method as described herein with any number of other support modules. For example, additional support modules could include support modules capable of determining a location, such as a global positioning system module, a cell phone capable of triangulating to determine a general location, as well as other methods of determining location. In addition, clocks and timers capable of recording when an event occurred would also be anticipated with any of the applications anticipated herein.

In addition, the method and devices herein could be used to monitor an inventory of known radiation sources. For example, such a device could be placed at a storage site of a radiation source to determine whether or not any material that generates a radiation material is removed from the storage site by monitoring a level of radiation over a period of time, and if the level of radiation decreases, indicating that a quantity of radiation source has been removed, providing an indication as such.

Another application would be to have a defined communication network whereby each of the individual devices described herein would be associated with a unique ID, either integrated on the device itself, or associated with an application of the device, whereby the device could communicate information to a central location whereby presence of radiation information is monitored. In one embodiment, such a clearing house would require each device reporting to it to have a unique ID, which could be assigned by the clearing house. Such a unique ID could be programmed and integrated onto the device itself or associated with an application of the device. Such information can be communicated of a network such as the internet, or wirelessly via satellite, or any combination of available networks.

It would be anticipated that the devices and methods herein can be located at public transportation locations, such as shipping locations, which would include both air and water shipping locations, as well as other locations such as railroad locations.

What is claimed is:
1. A device comprising:
   a first radiation-detecting structure disposed at a semiconductor substrate comprising a thermalizing material, the first radiation-detecting structure comprising a first radiation-reactive material sensitive to neutron radiation.
2. The device of claim 1, wherein the first radiation detecting structure comprises a charge storage structure, the charge storage structure disposed between the thermalizing material and a second thermalizing material.
3. The device of claim 1, wherein the thermalizing material comprises a material selected from the group consisting of hydrogen-containing materials, deuterium-containing materials, and carbon-containing materials.

4. The device of claim 1, wherein the thermalizing material comprises a polymer selected from the group of polymers consisting of polyolefins, polyamides, polyimides, polyesters, polystyrenes, polycarbonates, polyurethanes, polyethers, polysulphones, polyvinyls, and polyactic acids, or a combination thereof.

5. The device of claim 1, wherein the first radiation-detecting structure further comprises a second radiation-reactive material sensitive to a second radiation type.

6. The device of claim 1 further comprising:
a base;
the substrate overlying at least a portion of the base, and the radiation-detecting structure including an array of charge storage structures at the substrate.

7. The device of claim 6, wherein the radiation-detecting structure comprises a memory array comprising the array of charge storage structures.

8. The device of claim 7, wherein each of the charge storage structures within the array of charge storage structures comprise a conductive charge storage layer.

9. The device of claim 7, wherein each of the charge storage structures within the array of charge storage structures comprise a non-conductive charge storage layer.

10. The device of claim 7, wherein each of the charge storage structures within the array of charge storage structures comprise a nitrogen-containing layer disposed between and in direct contact with an underlying dielectric layer and an overlying dielectric layer.

11. The device of claim 6, wherein the substrate is disposed within an interior space within the base.

12. The device of claim 6, wherein the substrate has a diameter of at least about 10 cm.

13. The device of claim 6, wherein the substrate has an average thickness within a range between about 1 mm and about 5 mm.

14. The device of claim 6, further comprising a cover overlying the radiation-detecting structure.

15. The device of claim 14, wherein the cover is an interposer to provide electrical connections between the radiation-detecting structure and an external contact of the interposer.

16. A device comprising:
a first radiation-detecting structure comprising a charge-storage structure and a neutron radiation-reactive material; and
a second radiation-detecting structure comprising a charge-storage structure electrically coupled to the first radiation-detecting structure.

17. The device of claim 16, wherein the first radiation-detecting structure is part of a first substrate and the second radiation-detecting structure is part of a second substrate, wherein the first substrate and second substrate are different substrates.

18. The device of claim 17, further comprising a housing, the housing containing a plurality of substrates, each substrate of the plurality of substrates comprising a plurality of radiation-detecting structures.

19. The device of claim 18, wherein the array of radiation-detecting structures define a major plane of each respective substrate, and wherein each major plane of the respective substrates are coplanar with each other.

20. The device of claim 19, further comprising a thermalizing material disposed between each of the substrates of the plurality of substrates.

* * * * *